(12) United States Patent
Iwamoto

(10) Patent No.: US 11,509,284 B2
(45) Date of Patent: Nov. 22, 2022

(54) ACOUSTIC WAVE DEVICE AND RADIO-FREQUENCY FRONT-END CIRCUIT

(71) Applicant: Murata Manufacturing Co., Ltd., Nagaokakyo (JP)

(72) Inventor: Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 760 days.

(21) Appl. No.: 16/436,964

(22) Filed: Jun. 11, 2019

(65) Prior Publication Data
US 2019/0386639 A1    Dec. 19, 2019

(30) Foreign Application Priority Data
Jun. 18, 2018 (JP) .............................. JP2018-115466

(51) Int. Cl.
*H03H 9/02* (2006.01)
*H03H 3/08* (2006.01)
*H01Q 1/22* (2006.01)

(52) U.S. Cl.
CPC .......... *H03H 9/02574* (2013.01); *H01Q 1/22* (2013.01); *H03H 3/08* (2013.01); *H03H 9/02551* (2013.01); *H03H 9/02559* (2013.01); *H03H 9/02566* (2013.01); *H03H 9/02582* (2013.01); *H03H 9/02992* (2013.01); *H03H 9/02834* (2013.01)

(58) Field of Classification Search
CPC ........... H03H 9/02574; H03H 9/02992; H03H 9/02551; H03H 9/02559; H03H 9/02566; H03H 9/02582; H03H 9/02834
USPC ...... 310/313 R, 313 A, 313 B, 313 C, 313 D
See application file for complete search history.

(56) References Cited

U.S. PATENT DOCUMENTS

| | | | |
|---|---|---|---|
| 2014/0152146 A1* | 6/2014 | Kimura | H03H 9/02228 29/25.35 |
| 2017/0063332 A1 | 3/2017 | Gilbert et al. | |

* cited by examiner

*Primary Examiner* — Derek J Rosenau
(74) *Attorney, Agent, or Firm* — Keating & Bennett, LLP

(57) ABSTRACT

An acoustic wave device includes a piezoelectric layer, an IDT electrode, a high-acoustic-velocity support substrate, and a low-acoustic-velocity film. The high-acoustic-velocity support substrate is located on an opposite side of the piezoelectric layer from the IDT electrode in the thickness direction of the piezoelectric layer. The low-acoustic-velocity film is disposed between the high-acoustic-velocity support substrate and the piezoelectric layer in the thickness direction. The high-acoustic-velocity support substrate includes a base region and a surface region disposed nearer to the low-acoustic-velocity film than the base region in the thickness direction and whose crystal quality is worse than that of the base region. The surface region includes first and second layers disposed nearer to the base region than the first layer in the thickness direction and whose crystal quality is better than that of the first layer.

20 Claims, 8 Drawing Sheets

ACOUSTIC WAVE DEVICE AND RADIO-FREQUENCY FRONT-END CIRCUIT

CROSS REFERENCE TO RELATED APPLICATIONS

This application claims the benefit of priority to Japanese Patent Application No. 2018-115466 filed on Jun. 18, 2018. The entire contents of this application are hereby incorporated herein by reference.

BACKGROUND OF THE INVENTION

1. Field of the Invention

The present invention relates to acoustic wave devices and radio-frequency front-end circuits, and more specifically to an acoustic wave device in which a piezoelectric layer is included and a radio-frequency front-end circuit in which an acoustic wave device is included.

2. Description of the Related Art

Acoustic wave devices that include a piezoelectric layer and a substrate are known in the related art (for example, refer to U.S. Patent Application Publication No. 2017/0063332).

An acoustic wave device disclosed in U.S. Patent Application Publication No. 2017/0063332 includes a substrate, a layer, a piezoelectric layer, and interdigital transducer (IDT) electrodes. The substrate includes a bulk region and a surface region. The surface region is located at the interface of the substrate and the layer. In other words, the surface region is located between the bulk region and the layer.

However, when a laminated structure including a substrate and a piezoelectric layer is used, as in the acoustic wave device of the related art disclosed in U.S. Patent Application Publication No. 2017/0063332, a higher-order mode is generated at a higher frequency than the main-mode frequency. Further, if the crystal quality is made uniformly in the surface region in the substrate, which supports the piezoelectric layer, a problem of an increased higher-order mode arises.

SUMMARY OF THE INVENTION

Preferred embodiments of the present invention provide acoustic wave devices and radio-frequency front-end circuits that are each able to reduce a higher-order mode generated at a higher frequency than the main-mode frequency.

An acoustic wave device according to a preferred embodiment of the present invention includes a piezoelectric layer, an IDT electrode, a high-acoustic-velocity support substrate, and a low-acoustic-velocity film. The IDT electrode is directly or indirectly disposed on the piezoelectric layer. The high-acoustic-velocity support substrate is located on an opposite side of the piezoelectric layer from the IDT electrode in the thickness direction of the piezoelectric layer. The high-acoustic-velocity support substrate is a substrate in which a bulk wave propagates at a higher acoustic velocity than the acoustic velocity of a bulk wave that propagates in the piezoelectric layer. The low-acoustic-velocity film is disposed between the high-acoustic-velocity support substrate and the piezoelectric layer in the thickness direction. The low-acoustic-velocity film is a film in which a bulk wave propagates at a lower acoustic velocity than the acoustic velocity of a bulk wave that propagates in the piezoelectric layer. The high-acoustic-velocity support substrate includes a base region and a surface region. The surface region is disposed nearer to the low-acoustic-velocity film than the base region in the thickness direction. The surface region includes a first layer and a second layer. The second layer is disposed nearer to the base region than the first layer in the thickness direction. In the high-acoustic-velocity support substrate, the crystal quality of the base region is better than the crystal quality of the surface region. The crystal quality of the second layer is better than the crystal quality of the first layer.

An acoustic wave device according to a preferred embodiment of the present invention includes a piezoelectric layer, an IDT electrode, a support substrate, a low-acoustic-velocity film, and a high-acoustic-velocity film. The IDT electrode is directly or indirectly disposed on the piezoelectric layer. The support substrate is located on an opposite side of the piezoelectric layer from the IDT electrode in the thickness direction of the piezoelectric layer. The low-acoustic-velocity film is disposed between the support substrate and the piezoelectric layer in the thickness direction. The low-acoustic-velocity film is a film in which a bulk wave propagates at a lower acoustic velocity than the acoustic velocity of a bulk wave that propagates in the piezoelectric layer. The high-acoustic-velocity film is disposed between the low-acoustic-velocity film and the support substrate. The high-acoustic-velocity film is a film in which a bulk wave propagates at a higher acoustic velocity than the acoustic velocity of a bulk wave that propagates in the piezoelectric layer. The support substrate includes a base region and a surface region. The surface region is disposed nearer to the low-acoustic-velocity film than the base region in the thickness direction. The surface region includes a first layer and a second layer. The second layer is disposed nearer to the base region than the first layer in the thickness direction. In the support substrate, the crystal quality of the base region is better than the crystal quality of the surface region. The crystal quality of the second layer is better than the crystal quality of the first layer.

A radio-frequency front-end circuit according to a preferred embodiment of the present invention includes a first amplifier circuit, a second amplifier circuit, a transmit filter, and a receive filter. The first amplifier circuit amplifies a first transmit signal having a first frequency. The second amplifier circuit amplifies a second transmit signal having a second frequency, which is different from the first frequency. The transmit filter has a first pass band including the first frequency, is disposed between the first amplifier circuit and an antenna, and passes the first transmit signal. The receive filter has a second pass band and passes the receive signal received from the antenna. The second pass band includes at least one of a plurality of frequencies that satisfy $n \times Tx1 \pm m \times Tx2$, where $Tx1$ is the first frequency, $Tx2$ is the second frequency, and n and m are both a natural number. The transmit filter includes an acoustic wave device according to a preferred embodiment of the present invention.

Acoustic wave devices and radio-frequency front-end circuits according to preferred embodiments of the present invention are each able to reduce a higher-order mode generated at a higher frequency than the main-mode frequency.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detailed below with reference to the accompanying drawings.

Hereinafter, acoustic wave devices and radio-frequency front-end circuits according to a first preferred embodiment and a second preferred embodiment will be described with reference to the drawings. Figures described in the following preferred embodiments are schematic, and ratios of sizes or thicknesses of each element to sizes or thicknesses of another element in the figures do not necessarily represent a ratio of an actual size or thickness.

First Preferred Embodiment

First, a general configuration of an acoustic wave device 1 according to a first preferred embodiment of the present invention will be described with reference to the drawings.

Figure 1:
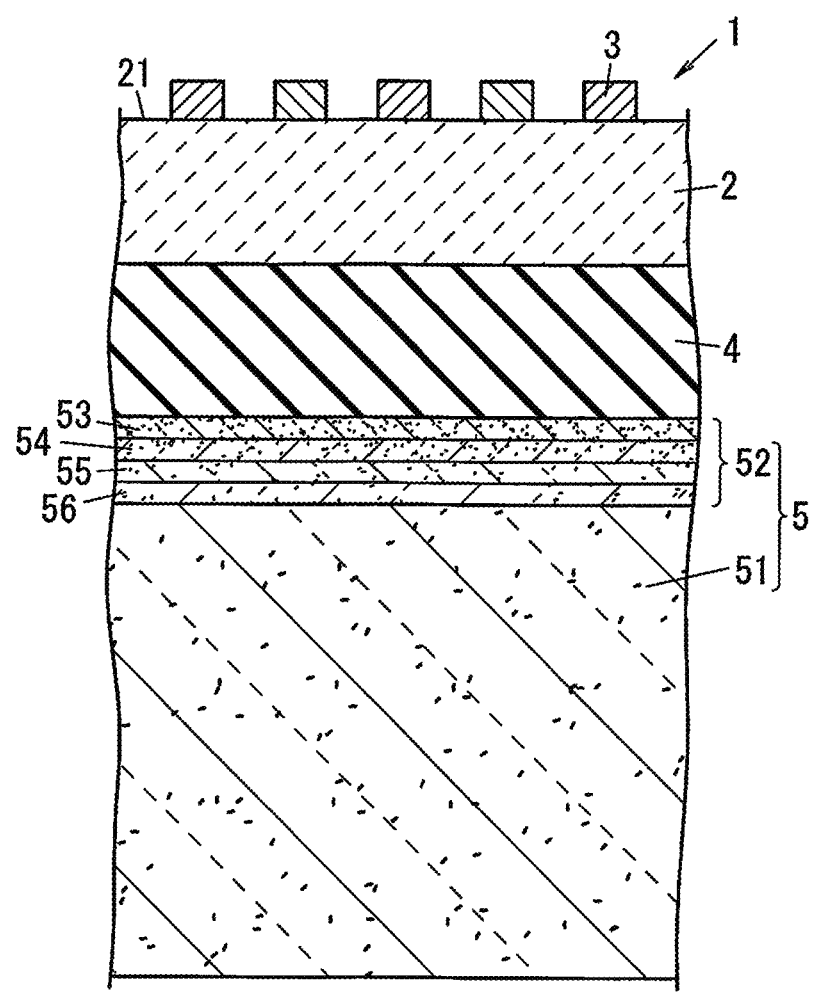
FIG. 1 is a cross sectional view of an acoustic wave device according to a first preferred embodiment of the present invention.

As depicted in FIG. 1, the acoustic wave device 1 according to the first preferred embodiment includes a piezoelectric layer 2, an interdigital transducer (IDT) electrode 3, a low-acoustic-velocity film 4, and a high-acoustic-velocity support substrate 5.

Next, elements of the acoustic wave device 1 according to the first preferred embodiment will be described with reference to the drawings.

The piezoelectric layer 2 is preferably made of, for example, a $\Gamma°$ rotated Y-cut X-propagated LiTaO$_3$ piezoelectric single crystal. A $\Gamma°$ rotated Y-cut X-propagated LiTaO$_3$ piezoelectric single crystal is a LiTaO$_3$ single crystal cut by a plane whose normal is parallel or substantially parallel to an axis rotated by $\Gamma°$ from the Y-axis to the Z-axis around the X-axis, where the X-axis, the Y-axis, and the Z-axis are three crystallographic axes of the LiTaO$_3$ piezoelectric single crystal, and a surface acoustic wave propagates in the X-axis direction. The cut angle $\Gamma$ (in degrees) of the piezoelectric layer 2 is provided by $\Gamma=\theta+90$, where the Euler angle of the piezoelectric layer 2 is denoted by ($\phi$, $\theta$, $\psi$). Here, $\Gamma$ is equivalent to $\Gamma \pm 180 \times n$, where n is a natural number. In other words, these two angles are crystallographically equivalent. The piezoelectric layer 2 is not limited to a $\Gamma°$ rotated Y-cut X-propagated LiTaO$_3$ piezoelectric single crystal and may be, for example, a $\Gamma°$ rotated Y-cut X-propagated LiTaO$_3$ piezoelectric ceramic.

The piezoelectric layer 2 is directly or indirectly disposed on the low-acoustic-velocity film 4. The piezoelectric layer 2 is preferably, for example, equal to or less than about 3.5$\lambda$ in thickness in the thickness direction (first direction D1) of the high-acoustic-velocity support substrate 5. When the piezoelectric layer 2 is equal to or less than about 3.5$\lambda$ in thickness, the Q value is increased. Further, if the piezoelectric layer 2 is equal to or less than about 2.5$\lambda$ in thickness, the temperature coefficient of frequency (TCF) is able to be decreased. In addition, if the piezoelectric layer 2 is equal to or less than about 1.5$\lambda$ in thickness, the velocity of an acoustic wave is able to be easily adjusted.

When the piezoelectric layer 2 is equal to or less than about 3.5$\lambda$ in thickness, although the Q value increases as described above, a higher-order mode is generated.

In the acoustic wave device 1, a mode of an acoustic wave that propagates in the piezoelectric layer 2 may be a longitudinal mode, a shear horizontal (SH) mode, a shear vertical (SV) mode, or a mixed mode of these modes. As the main mode, the acoustic wave device 1 uses a mode mainly composed of the SH mode. A higher-order mode is a spurious mode generated at a higher frequency than the main mode frequency of the acoustic wave that propagates in the piezoelectric layer 2. It may be confirmed whether the main mode of the acoustic wave that propagates in the piezoelectric layer 2 is the "mode mainly composed of the SH mode" by analyzing distortion. The distortion analysis is able to be performed by analyzing displacement distribution by using the finite element method, which uses parameters, such as parameters regarding the piezoelectric layer 2 (material, Euler angle, thickness, and other parameters), parameters regarding the IDT electrode 3 (material, thickness, period of electrode fingers, and other parameters), and parameters regarding the low-acoustic-velocity film 4 (material, thickness, and other parameters). The Euler angle of the piezoelectric layer 2 is able to be determined by performing an analysis.

If the acoustic wave device 1 is a resonator, the main mode indicates a mode of a wave that has the largest difference between the impedance at the resonant frequency and the impedance at the anti-resonant frequency under the condition that at least one of the resonant frequency and the anti-resonant frequency of the resonator is present in the pass band of the filter. If the acoustic wave device 1 is a filter, the main mode indicates a mode of a wave used to form the pass band of the filter.

The material of the piezoelectric layer 2 is not limited to LiTaO$_3$ and may be, for example, LiNbO$_3$. If the piezoelectric layer 2 is made of, for example, a Y-cut X-propagated LiNbO$_3$ piezoelectric single crystal or piezoelectric ceramic, the acoustic wave device 1 is able to use a mode mainly including the SH mode as the main mode by using a Love wave as an acoustic wave. The single crystal material and the cut angle of the piezoelectric layer 2 may be determined as appropriate in accordance with, for example, the specification required for the filter (the filter characteristics, such as bandpass characteristics, attenuation characteristics, temperature characteristics, and a bandwidth).

Figure 2A:
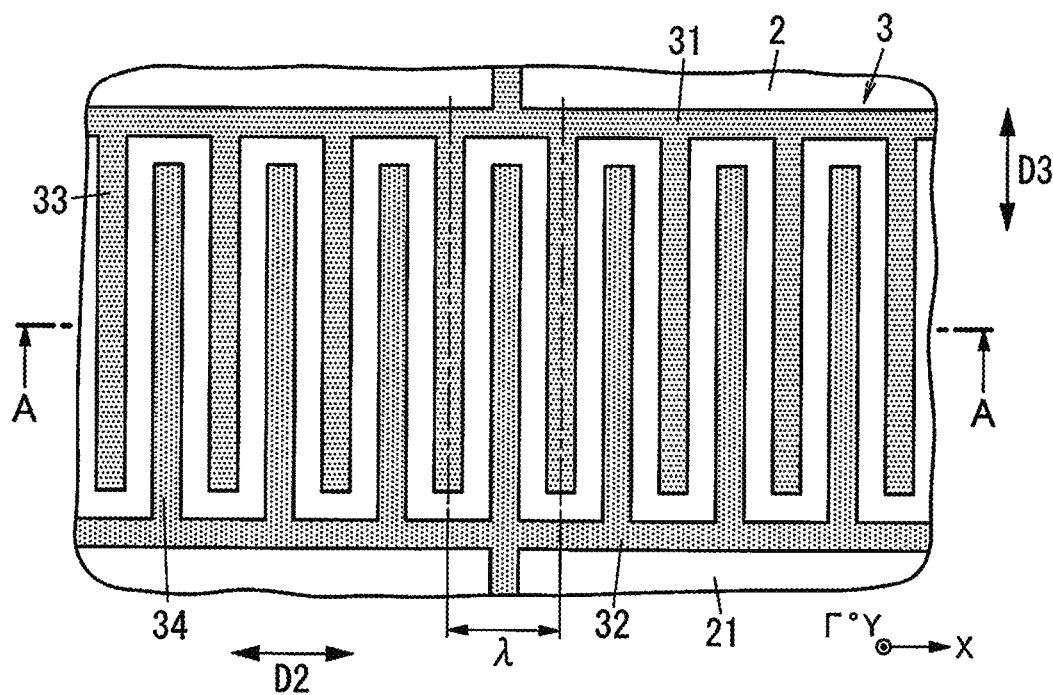
FIG. 2A is a plan view of the main portion of the acoustic wave device according to the first preferred embodiment of the present invention.
Figure 2B:
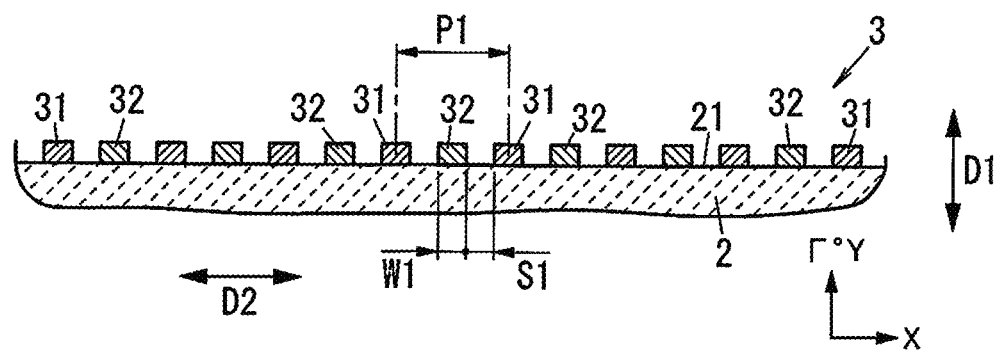
FIG. 2B is a cross sectional view taken along line A-A of FIG. 2A.

As depicted in FIGS. 2A and 2B, the IDT electrode 3 includes a first busbar 31, a second busbar 32, a plurality of first electrode fingers 33, and a plurality of second electrode fingers 34 and is disposed on a main surface 21 of the piezoelectric layer 2.

The first busbar 31 is elongated in a second direction D2 and is electrically connected to the plurality of first electrode fingers 33. The second busbar 32 is elongated in the second direction D2 and is electrically connected to the plurality of second electrode fingers 34. The second direction D2 is perpendicular or substantially perpendicular to the first direction D1.

The plurality of first electrode fingers 33 are arranged in the second direction D2 and aligned alongside each other. Each of the plurality of first electrode fingers 33 is elongated in a third direction D3. The plurality of first electrode fingers 33 are arranged in the second direction D2, run parallel or substantially parallel to each other, and face each other. The plurality of second electrode fingers 34 are arranged in the second direction D2 and aligned alongside each other. Each of the plurality of second electrode fingers 34 is elongated in the third direction D3. The plurality of second electrode fingers 34 are arranged in the second direction D2, run parallel or substantially parallel to each other, and face each other. The plurality of first electrode fingers 33 and the plurality of second electrode fingers 34 are alternately disposed. The third direction D3 is perpendicular or substantially perpendicular to both of the first direction D1 and the second direction D2.

The period of electrode fingers of the IDT electrode 3 is equal or substantially equal to the interval between the corresponding sides of a first electrode finger 33 and a second electrode finger 34 that are adjacent to each other. As depicted in FIG. 2B, the period of electrode fingers of the IDT electrode 3 is defined as a sum of W1 and S1 (W1+S1), where W1 is the width of the first electrode finger 33 and also the width of the second electrode finger 34 and S1 is the space width between a first electrode finger 33 and a second electrode finger 34 that are adjacent to each other. The metallization ratio of the IDT electrode 3, which is the width of an electrode finger W1 divided by the period of electrode fingers, is defined as W1/(W1+S1). The metallization ratio is equal or substantially equal to, for example, about 0.5. The acoustic-wave wavelength $\lambda$, which is determined by the period of electrode fingers of the IDT electrode 3, is defined by the period of repetition P1 of the plurality of first electrode fingers 33 and the plurality of second electrode fingers 34.

The material of the IDT electrode 3 is preferably an appropriate metal material such as, for example, Al, Cu, Pt, Au, Ag, Ti, Ni, Cr, Mo, W, and an alloy mainly including one of these metals. Further, the IDT electrode 3 may have a laminated structure including a plurality of metal films made of these metals or alloys.

The low-acoustic-velocity film 4, which is depicted in FIG. 1, is a film in which a transverse bulk wave propagates at a lower acoustic velocity than the velocity of the acoustic wave that propagates in the piezoelectric layer 2. The low-acoustic-velocity film 4 is disposed between the high-acoustic-velocity support substrate 5 and the piezoelectric layer 2. Since the low-acoustic-velocity film 4 is disposed between the high-acoustic-velocity support substrate 5 and the piezoelectric layer 2, the velocity of the acoustic wave decreases. Acoustic wave energy is essentially concentrated in a medium having a low acoustic velocity. Thus, the effect of confining of acoustic wave energy in the piezoelectric layer 2 and the IDT electrode 3, by which the acoustic wave is excited, is able to be enhanced. As a result, loss is able to be reduced, and the Q value is able to be increased compared with the case in which the low-acoustic-velocity film 4 is not provided.

The material of the low-acoustic-velocity film 4 is preferably, for example, silicon oxide. The material of the low-acoustic-velocity film 4 is not limited to silicon oxide and may be a compound provided by adding fluorine, carbon, or boron to glass, silicon oxynitride, tantalum oxide, or silicon oxide, for example. Alternatively, the material of the low-acoustic-velocity film 4 may be a material mainly including the above materials.

The low-acoustic-velocity film 4 is preferably, for example, equal to or less than about 2.0$\lambda$ in thickness, where X is the acoustic-wave wavelength determined by the period of electrode fingers (the first electrode fingers 33 and the second electrode fingers 34 described below) of the IDT electrode 3. Since the low-acoustic-velocity film 4 is equal to or less than about 2.0$\lambda$ in thickness, the film stress is able to be reduced, and, as a result, the warp and bow of a wafer is able to be reduced, leading to improvement in yield rate and stabilization of characteristics. Further, if the low-acoustic-velocity film 4 is equal to or greater than about 0.1$\lambda$ and equal to or less than about 0.5$\lambda$ in thickness, the electromechanical coupling coefficient hardly changes. The low-acoustic-velocity film 4 may have a multiple layer structure including a plurality of laminated layers in each of which the acoustic velocity of a propagating transverse bulk wave is low. The plurality of laminated layers in each of which the acoustic velocity of a propagating transverse bulk wave is low may be interleaved with an intermediate layer made of titanium, nickel, or other suitable material. The thickness of the low-acoustic-velocity film 4 in such a case corresponds to the total thickness of the multiple layer structure.

As depicted in FIG. 1, the high-acoustic-velocity support substrate 5 is located on an opposite side of the piezoelectric layer 2 from the IDT electrode 3. The acoustic velocity of a bulk wave that propagates in the high-acoustic-velocity support substrate 5 is higher than the velocity of the acoustic wave that propagates in the piezoelectric layer 2. The high-acoustic-velocity support substrate 5 supports the low-acoustic-velocity film 4, the piezoelectric layer 2, and the IDT electrode 3.

The bulk wave that propagates in the high-acoustic-velocity support substrate 5 is the bulk wave that has the lowest acoustic velocity among a plurality of bulk waves that propagate in the high-acoustic-velocity support substrate 5.

The high-acoustic-velocity support substrate 5 confines the acoustic wave in a portion at which the piezoelectric layer 2 and the low-acoustic-velocity film 4 are laminated so as to prevent or reduce the leakage of the acoustic wave into the high-acoustic-velocity support substrate 5.

The material of the high-acoustic-velocity support substrate 5 is preferably, for example, silicon, and the high-acoustic-velocity support substrate 5 is preferably, for example, 125 μm in thickness. The material of the high-acoustic-velocity support substrate 5 is not limited to silicon and may be a piezoelectric material, a ceramic, magnesia, or diamond, for example. Piezoelectric materials such as silicon carbide, aluminum nitride, aluminum oxide, silicon nitride, sapphire, lithium tantalate, lithium niobate, and quartz, and various ceramics such as alumina, zirconia, cordierite, mullite, steatite, and forsterite, for example, may be used. Alternatively, a material mainly including one of the above materials, or a material mainly including a mixture of the above materials may be used.

The high-acoustic-velocity support substrate 5 includes a base region 51 and a surface region 52.

The base region 51 corresponds to a bulk region.

The surface region 52 is located on the low-acoustic-velocity film 4 side of the base region 51 in the first direction D1. The crystal quality of the surface region 52 is worse than the crystal quality of the base region 51. The crystal quality described in the present specification corresponds to, for example, the number of diffraction spots per unit area in an image of electron-diffraction pattern. As the number of diffraction spots decreases, the crystal quality increases, and as the number of diffraction spots increases, the crystal quality decreases. The sentence "The crystal quality of the surface region 52 is worse than the crystal quality of the base region 51." indicates a case in which the number of diffraction spots for the surface region 52 is less than the number of diffraction spots for the base region 51.

The surface region 52 includes a plurality of layers. In more detail, the surface region 52 includes a first layer 53, a second layer 54, a third layer 55, and a fourth layer 56. The first layer 53 is disposed closest to the low-acoustic-velocity film 4 in the first direction D1 among the layers included in the surface region 52. The first layer 53 is in contact with the low-acoustic-velocity film 4. The second layer 54 is disposed adjacent to the first layer 53 in the first direction D1. The third layer is disposed adjacent to the second layer 54 in the first direction D1. The fourth layer 56 is disposed adjacent to the third layer 55 in the first direction D1. The fourth layer 56 is disposed closest to the base region 51 in the first direction D1. The fourth layer 56 is in contact with the base region 51.

The crystal quality of the surface region 52 changes in the first direction D1. In more detail, the crystal quality of the second layer 54 is better than the crystal quality of the first layer 53. The crystal quality of the third layer 55 is better than the crystal quality of the second layer 54. The crystal quality of the fourth layer 56 is better than the crystal quality of the third layer 55. In other words, the crystal quality of the surface region 52 is better at a position located closer to the base region 51 and farther from the low-acoustic-velocity film 4.

In the surface region 52, as the crystal quality improves, the acoustic velocity of a bulk wave that propagates in the high-acoustic-velocity support substrate 5 increases. On the other hand, as the crystal quality degrades, the acoustic velocity of a bulk wave that propagates in the high-acoustic-velocity support substrate 5 decreases.

Figure 3:
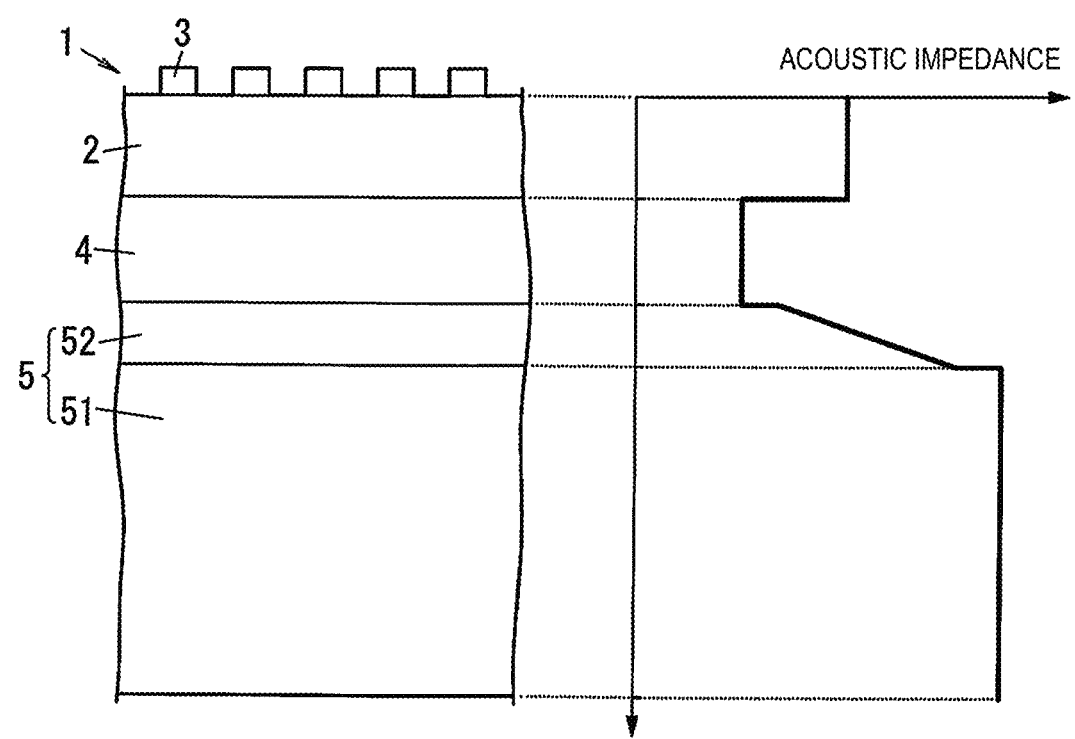
FIG. 3 illustrates distribution of acoustic impedance in the thickness direction of the acoustic wave device according to the first preferred embodiment of the present invention.

As described above, the crystal quality of the surface region 52 is better at a position located closer to the base region 51 and farther from the low-acoustic-velocity film 4. Consequently, as depicted in FIG. 3, the acoustic impedance of the surface region 52 is higher at a position located closer to the base region 51 and farther from the low-acoustic-velocity film 4. The acoustic impedance of the surface region 52 is higher than the acoustic impedance of the low-acoustic-velocity film 4 and lower than the acoustic impedance of the base region 51.

As described above, since the surface region 52 is provided, the phase of a higher-order mode, which is generated at a higher frequency than the fundamental mode frequency, is able to be reduced.

Figure 4:
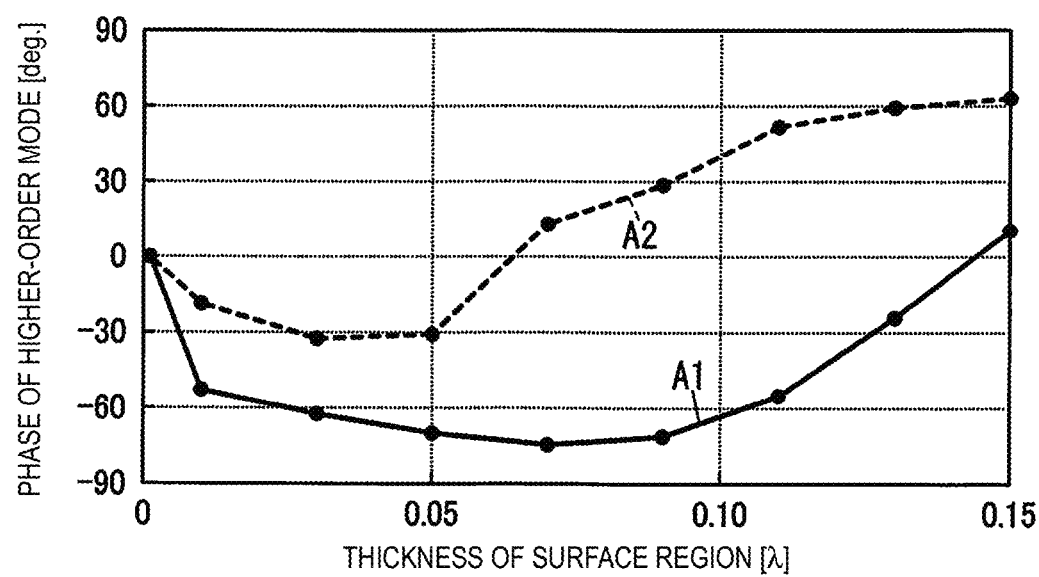
FIG. 4 is a graph of phases of a higher-order mode of the acoustic wave device according to the first preferred embodiment of the present invention.

Next, the relationship between the thickness of the surface region 52 in the first direction D1 and the magnitude of the phase of a higher-order mode will be described with reference to FIG. 4. FIG. 4 depicts the phase of a higher-order mode plotted against the thickness of the surface region 52. The characteristic curve A1 in FIG. 4 indicates higher-order mode mode characteristics of the acoustic wave device 1 according to the first preferred embodiment. The characteristic curve A2 in FIG. 4 indicates higher-order mode characteristics of an acoustic wave device in which the crystal quality of the surface region does not change in the thickness direction (an acoustic wave device according to a comparative example). In FIG. 4, the thickness of the surface region 52 is normalized by the acoustic-wave wavelength λ, which is determined by the period of electrode fingers of the IDT electrode 3.

When the surface region 52 is greater than 0 and equal to or less than about 0.15, in thickness, the higher-order mode indicated by the characteristic curve A1 is less than the higher-order mode indicated by the characteristic curve A2 in the case in which the thickness of the surface region 52 is the same as the thickness of the surface region in the acoustic wave device according to the comparative example. In other words, the higher-order mode of the acoustic wave device 1 according to the first preferred embodiment is less than the higher-order mode of the acoustic wave device according to the comparative example.

Further, when the surface region 52 is equal to or less than about 0.145λ in thickness, the acoustic wave device 1 according to the first preferred embodiment, which has the surface region 52 greater than 0 in thickness, has the higher-order mode less than the higher-order mode in the case in which the surface region 52 is absent (when the surface region 52 is equal to zero in thickness). The surface region 52 equal to or greater than about 0.02λ and equal to or less than about 0.11λ in thickness is more preferable, and the phase of the higher-order mode is equal to about −50° or less in such a case. The surface region 52 equal to or greater than about 0.025λ and equal to or less than about 0.105λ in thickness is further preferable, and the phase of the higher-order mode in the surface region 52 is equal to about −60° or less in such a case. In the example depicted in FIG. 4, when the surface region 52 is equal to about 0.07λ in thickness, the phase of the higher-order mode has a minimum value of about −75°.

In contrast, when the surface region is equal to or less than about 0.06λ in thickness, the acoustic wave device according to the comparative example has the higher-order mode less than the higher-order mode in the case in which the surface region is absent. However, when the surface region is greater than about 0.06λ in thickness, the acoustic wave device according to the comparative example has the higher-order mode greater than the higher-order mode in the case in which the surface region is absent.

As described above, the acoustic wave device 1 according to the first preferred embodiment is able to reduce the higher-order mode compared with the acoustic wave device according to the comparative example. Further, compared with the acoustic wave device according to the comparative example, the acoustic wave device 1 according to the first preferred embodiment is able to enlarge the surface region 52 thickness range in which the higher-order mode is less than the higher-order mode in the case where the surface region 52 is absent.

Next, a method of manufacturing the acoustic wave device 1 according to the first preferred embodiment will be described with reference to FIG. 1. The acoustic wave device 1 according to the first preferred embodiment is manufactured by the first step through the fifth step.

In the first step, a high-acoustic-velocity support substrate 5 is prepared.

In the second step, ion irradiation is performed on a main surface of the high-acoustic-velocity support substrate 5, the main surface being the surface on which the low-acoustic-velocity film 4 is to be disposed. Performing the ion irradiation degrades the crystal quality of a region on the main surface side of the high-acoustic-velocity support substrate 5 and forms the surface region 52, which has worse crystal quality than the crystal quality of the base region 51, which is a region that is not damaged by the ion irradiation. Since the ion irradiation is performed from the main surface side, a layer closer to the main surface (the first layer 53 in the example in FIG. 1) has worse crystal quality, and a layer farther from the main surface (the fourth layer 56 in the example in FIG. 1) has better crystal quality. However, the crystal quality of the surface region 52 becomes worse than the crystal quality of the base region 51. The base region 51 maintains the crystal quality of a silicon substrate, from which the high-acoustic-velocity support substrate 5 is formed.

In the third step, the low-acoustic-velocity film 4 is formed on the high-acoustic-velocity support substrate 5. In the fourth step, the piezoelectric layer 2 is formed on the low-acoustic-velocity film 4. In the fifth step, the IDT electrode 3 is formed on the piezoelectric layer 2.

The manufacturing method described above is a non-limiting example of a method of manufacturing the acoustic wave device 1, and the acoustic wave device 1 may be manufactured using other manufacturing methods. For example, the surface region 52 may be formed by film deposition, instead of ion irradiation. In the following, another non-limiting example of a method of manufacturing the acoustic wave device 1 according to the first preferred embodiment will be described.

In the first step, a support substrate that defines the base region 51 is prepared. The support substrate may be the same as or similar to the high-acoustic-velocity support substrate 5.

In the second step, the surface region 52 is formed by depositing films on the support substrate, instead of ion irradiation. In more detail, the fourth layer 56, the third layer 55, the second layer 54, and the first layer 53 are formed in this order under different film deposition conditions.

Then, the third step, the fourth step, and the fifth step are performed similarly to the first preferred embodiment. The low-acoustic-velocity film 4, the piezoelectric layer 2, and the IDT electrode 3 are formed on the high-acoustic-velocity support substrate 5.

In the acoustic wave device 1 manufactured by the manufacturing method described above, the crystal quality of the surface region 52 is also able to be changed in the thickness direction.

Next, a method of measuring (evaluating) the crystal quality of the high-acoustic-velocity support substrate 5 of the acoustic wave device 1 according to the first preferred embodiment will be described with reference to FIGS. 5A to 5D.

Figure 5A:
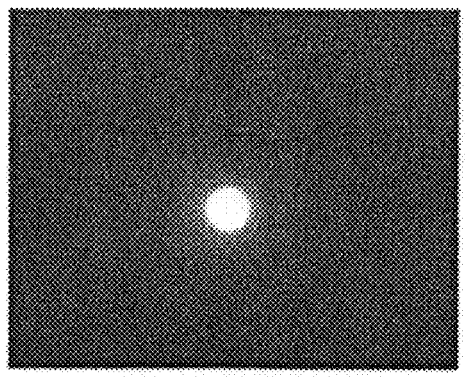
FIGS. 5A to 5D depict images of electron-diffraction patterns of surface regions of the acoustic wave device according to the first preferred embodiment of the present invention.
Figure 5B:
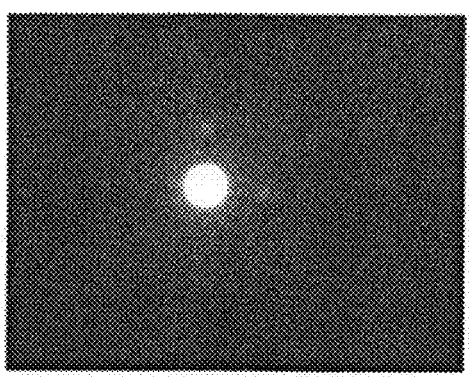
Figure 5C:
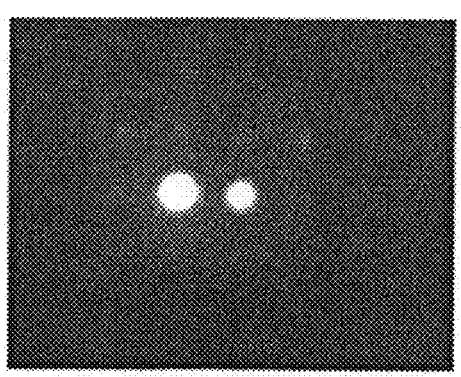
Figure 5D:
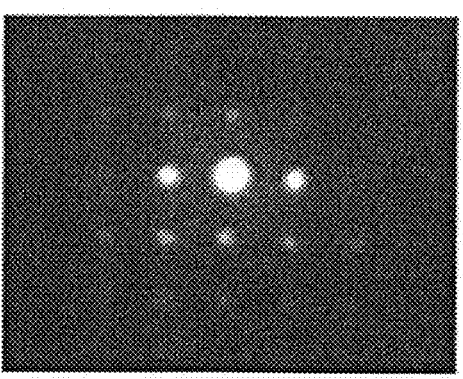

Here, the crystal quality is measured using the electron-diffraction method. FIG. 5A depicts an image of an electron-diffraction pattern of the first layer 53 of the surface region 52, and FIG. 5B depicts an image of an electron-diffraction pattern of the second layer 54 of the surface region 52. FIG. 5C depicts an image of an electron-diffraction pattern of the third layer 55 of the surface region 52, and FIG. 5D depicts an image of an electron-diffraction pattern of the fourth layer 56 of the surface region 52. FIGS. 5A to 5D depict images of electron-diffraction patterns of areas of the same size. As depicted in FIGS. 5A to 5D, the number of diffraction spots is largest for FIG. 5D and smallest for FIG. 5A. Since the number of diffraction spots increases as the crystal quality increases, if the four layers are listed in order of increasing crystal quality, the order is the first layer 53, the second layer 54, the third layer 55, and the fourth layer 56. In other words, the crystal quality of a layer in the surface region 52 is better as the layer is closer to the base region 51.

As described above, the tendency of the crystal quality of the surface region 52 is able to be determined by using the electron-diffraction method.

A method of measuring the crystal quality of the acoustic wave device 1 is not limited to the electron-diffraction method and may be other methods. A method of measuring the crystal quality of the acoustic wave device 1 may be, for example, the X-ray diffraction method.

Next, a radio-frequency front-end circuit 101 according to a first example of the first preferred embodiment will be described with reference to FIG. 6.

Figure 6:
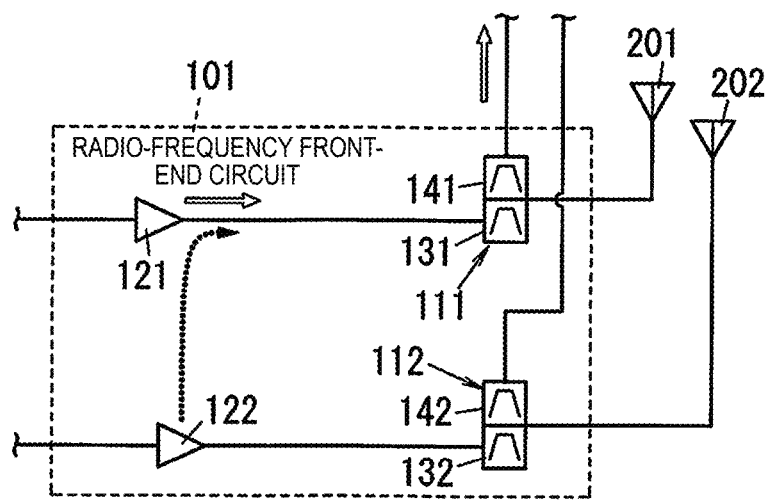
FIG. 6 is a circuit diagram of a radio-frequency front-end circuit according to a first example of the first preferred embodiment of the present invention.

As depicted in FIG. 6, the radio-frequency front-end circuit 101 includes a first multiplexer 111, a second multiplexer 112, a first amplifier circuit 121, and a second amplifier circuit 122.

The first amplifier circuit 121 amplifies a first transmit signal received from a circuit (for example, a radio-frequency signal processing circuit) located outside the radio-frequency front-end circuit 101 and outputs the amplified first transmit signal to a first antenna 201. The first amplifier circuit 121 is a power amplifier circuit.

The second amplifier circuit 122 amplifies a second transmit signal received from a circuit (for example, a radio-frequency signal processing circuit) located outside the radio-frequency front-end circuit 101 and outputs the amplified second transmit signal to a second antenna 202. The second amplifier circuit 122 is a power amplifier circuit.

The first multiplexer 111 includes a first transmit filter 131 and a first receive filter 141.

The first transmit filter 131 passes a signal in the pass band of the first transmit filter 131 and attenuates a signal outside the pass band. In more detail, the first transmit filter 131 passes the first transmit signal received from the first amplifier circuit 121 and outputs the first transmit signal to the first antenna 201.

The first receive filter 141 passes a signal in the pass band of the first receive filter 141 and attenuates a signal outside the pass band. In more detail, the first receive filter 141 passes the first receive signal received from the first antenna 201.

The second multiplexer 112 includes a second transmit filter 132 and a second receive filter 142.

The second transmit filter 132 passes a signal in the pass band of the second transmit filter 132 and attenuates a signal outside the pass band. In more detail, the second transmit filter 132 passes the second transmit signal received from the second amplifier circuit 122 and outputs the second transmit signal to the second antenna 202.

The second receive filter 142 passes a signal in the pass band of the second receive filter 142 and attenuates a signal outside the pass band. In more detail, the second receive filter 142 passes the second receive signal received from the second antenna 202.

In the radio-frequency front-end circuit 101, the acoustic wave device 1 (refer to FIG. 1) is used for the first transmit filter 131.

The frequencies of the first transmit signal, the first receive signal, the second transmit signal, and the second receive signal may preferably be the following combination, for example. The frequency of the first transmit signal is in the transmit frequency band of Band 1 (about 1950 MHz band) according to the 3rd Generation Partnership Project (3GPP) Long Term Evolution (LTE) standard, the frequency of the first receive signal is in the receive frequency band of Band 1 (about 2140 MHz band), the frequency of the second transmit signal is in the transmit frequency band of Band 3 (about 1760 MHz band) according to the 3GPP LTE standard, and the frequency of the second receive signal is in the receive frequency band of Band 3 (about 1855 MHz band).

The first transmit signal is input to the first transmit filter 131, for which the acoustic wave device 1 is used, and the second transmit signal is also simultaneously input as an interference wave to the first transmit filter 131. Then, a higher-order mode having a frequency equal to the difference (about 2140 MHz) between the frequencies of the second harmonic (about 3900 MHz) of the first transmit signal and the fundamental wave (about 1760 MHz) of the second transmit signal is generated.

The frequency difference overlaps the frequency band of the first receive signal, and thus, there is a possibility that a harmonic having the frequency equal to the frequency difference leaks into the receive side.

However, since the acoustic wave device 1 is used for the first transmit filter 131 in the radio-frequency front-end circuit 101, the higher-order mode is able to be reduced or prevented, and the harmonic having the frequency equal or substantially equal to the frequency difference is also able to be reduced or prevented.

The situation is the same or similar if the frequencies of the first transmit signal, the first receive signal, the second transmit signal, and the second receive signal are the following combination. The frequency of the first transmit signal is in the transmit frequency band of Band 2 (about 1860 MHz band), the frequency of the first receive signal is in the receive frequency band of Band 2 (about 1940 MHz band), the frequency of the second transmit signal is in the transmit frequency band of Band 66 (about 1780 MHz band), and the frequency of the second receive signal is in the receive frequency band of Band 66 (about 2180 MHz band).

Another example of the frequencies of the first transmit signal, the first receive signal, the second transmit signal, and the second receive signal is the following combination. The frequency of the first transmit signal is in the transmit frequency band of Band 3 (about 1720 MHz band), the frequency of the first receive signal is in the receive frequency band of Band 3 (about 1815 MHz band), the frequency of the second transmit signal is in the transmit frequency band of Band 5 (about 837.5 MHz band) according to the 3GPP LTE standard, and the frequency of the second receive signal is in the receive frequency band of Band 5 (about 882.5 MHz band).

In this case, the acoustic wave device 1 (refer to FIG. 1) is used for the second transmit filter 132. The second transmit signal is input to the second transmit filter 132, and the first transmit signal is also simultaneously input as an interference wave to the second transmit filter 132. Then, a higher-order mode having a frequency equal to the difference (about 882.5 MHz) between the frequencies of the fundamental wave (about 1720 MHz) of the first transmit signal and the fundamental wave (about 837.5 MHz) of the second transmit signal is generated.

However, since the acoustic wave device 1 is used for the second transmit filter 132 in the radio-frequency front-end circuit 101, the higher-order mode is also able to be reduced or prevented.

Next, a radio-frequency front-end circuit 102 according to a second example of the first preferred embodiment will be described with reference to FIG. 7.

Figure 7:
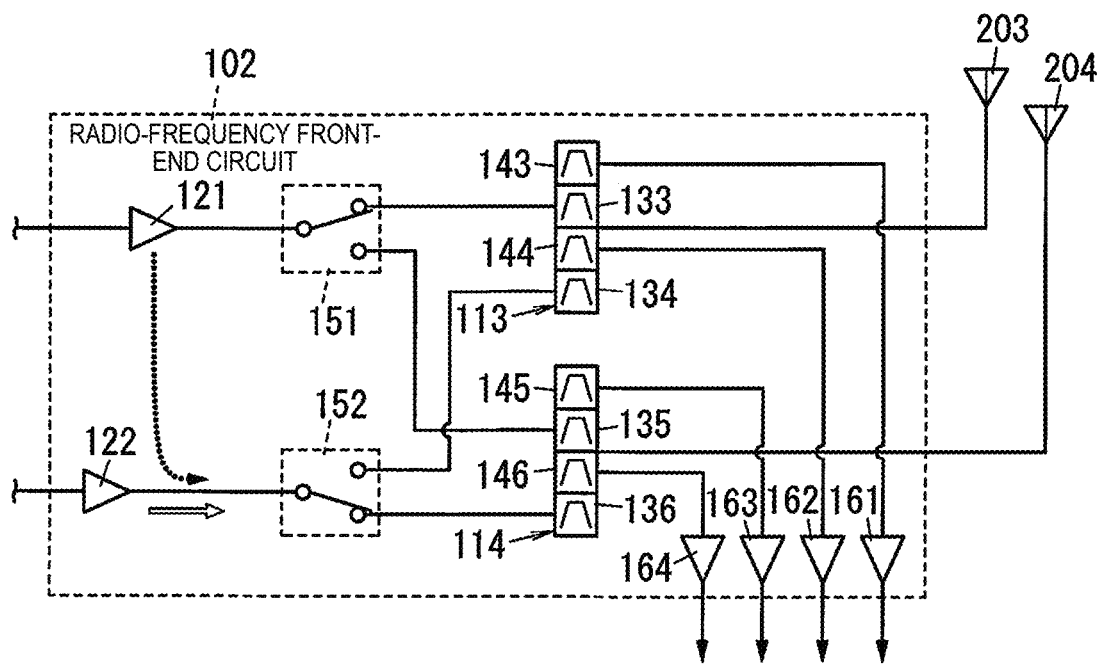
FIG. 7 is a circuit diagram of a radio-frequency front-end circuit according to a second example of the first preferred embodiment of the present invention.

As depicted in FIG. 7, the radio-frequency front-end circuit 102 includes a first multiplexer 113, a second multiplexer 114, a first amplifier circuit 121, a second amplifier circuit 122, switches 151, 152, and third amplifier circuits 161-164.

The first amplifier circuit 121 amplifies a first transmit signal received from a circuit (for example, a radio-frequency signal processing circuit) located outside the radio-frequency front-end circuit 102 and outputs the amplified first transmit signal to a first antenna 203. The first amplifier circuit 121 is a power amplifier circuit.

The second amplifier circuit 122 amplifies a second transmit signal received from a circuit (for example, a radio-frequency signal processing circuit) located outside the radio-frequency front-end circuit 102 and outputs the amplified second transmit signal to a second antenna 204. The second amplifier circuit 122 is a power amplifier circuit.

The first multiplexer 113 includes a first transmit filter 133, a second transmit filter 134, a first receive filter 143, and a second receive filter 144.

The first transmit filter 133 passes a signal in the pass band of the first transmit filter 133 and attenuates a signal outside the pass band. In more detail, the first transmit filter 133 passes the first transmit signal received from the first amplifier circuit 121 and outputs the first transmit signal to the first antenna 203.

The second transmit filter 134 passes a signal in the pass band of the second transmit filter 134 and attenuates a signal outside the pass band. In more detail, the second transmit filter 134 passes the second transmit signal received from the second amplifier circuit 122 and outputs the second transmit signal to the first antenna 203.

The first receive filter 143 passes a signal in the pass band of the first receive filter 143 and attenuates a signal outside the pass band. In more detail, the first receive filter 143 passes the first receive signal received from the first antenna 203.

The second receive filter 144 passes a signal in the pass band of the second receive filter 144 and attenuates a signal outside the pass band. In more detail, the second receive filter 144 passes the second receive signal received from the first antenna 203.

The second multiplexer 114 includes a first transmit filter 135, a second transmit filter 136, a first receive filter 145, and a second receive filter 146.

The first transmit filter 135 passes a signal in the pass band of the first transmit filter 135 and attenuates a signal outside the pass band. In more detail, the first transmit filter 135 passes the third transmit signal received from the first amplifier circuit 121 and outputs the third transmit signal to the second antenna 204.

The second transmit filter 136 passes a signal in the pass band of the second transmit filter 136 and attenuates a signal outside the pass band. In more detail, the second transmit filter 136 passes the fourth transmit signal received from the second amplifier circuit 122 and outputs the fourth transmit signal to the second antenna 204.

The first receive filter 145 passes a signal in the pass band of the first receive filter 145 and attenuates a signal outside the pass band. In more detail, the first receive filter 145 passes the third receive signal received from the second antenna 204.

The second receive filter 146 passes a signal in the pass band of the second receive filter 146 and attenuates a signal outside the pass band. In more detail, the second receive filter 146 passes the fourth receive signal received from the second antenna 204.

The switches 151 and 152 are respectively connected to the first amplifier circuit 121 and the second amplifier circuit 122. The switch 151 is connected to the first amplifier 121 and switches the first amplifier circuit 121 to be connected to the first antenna 203 or the second antenna 204. The switch 152 is connected to the second amplifier circuit 121 and the switches the second amplifier circuit 122 to be connected to the first antenna 203 or the second antenna 204.

The third amplifier circuits 161-164 amplify signals from the receive filters 143, 133, 145, and 146. The third amplifier circuit 161 is connected to the first receive filter 143, the third amplifier circuit 162 is connected to the second receive filter 144, the third amplifier circuit 163 is connected to the third receive filter 145, and the third amplifier circuit 164 is connected to the forth receive filter 146. The third amplifier 161 amplifies the first receive signal received from the first receive filter 143 and outputs the amplified first receive signal to a circuit (for example, a radio-frequency signal processing circuit) located outside the radio-frequency front-end circuit 102. The third amplifier circuit 162 amplifies the second receive signal received from the second receive filter 143 and outputs the amplified second receive signal to a circuit located outside the radio-frequency front-end circuit 102. The third amplifier circuit 163 amplifies the third receive signal received from the third receive filter 143 and outputs the amplified third receive signal to a circuit located outside the radio-frequency front-end circuit 102. The third amplifier circuit 164 amplifies the fourth receive signal received from the fourth receive filter 143 and outputs the amplified fourth receive signal to a circuit located outside the radio-frequency front-end circuit 102. The third amplifier circuits 61-64 are preferably low noise amplifiers, for example.

The radio-frequency front-end circuit 102 does not necessarily include the switches 151, 152 or the third amplifier circuits 161-164.

In the radio-frequency front-end circuit 102, the acoustic wave device 1 (refer to FIG. 1) is used for the second transmit filter 136 and the second receive filter 146.

The frequencies of the first transmit signal, the first receive signal, the second transmit signal, the second receive signal, the third transmit signal, the third receive signal, the fourth transmit signal, and the fourth receive signal may preferably be the following combination, for example. The frequency of the first transmit signal is in the transmit frequency band of Band 3 (about 1720 MHz band), the frequency of the first receive signal is in the receive frequency band of Band 3 (about 1855 MHz band), the frequency of the second transmit signal is in the transmit frequency band of Band 1 (about 1950 MHz band), and the frequency of the second receive signal is in the receive frequency band of Band 1 (about 2140 MHz band). In addition, the frequency of the third transmit signal is in the transmit frequency band of Band 66 (about 1780 MHz band), the frequency of the third receive signal is in the receive frequency band of Band 66 (about 2180 MHz band), the frequency of the fourth transmit signal is in the transmit frequency band of Band 2 (about 1860 MHz band), and the frequency of the fourth receive signal is in the receive frequency band of Band 2 (about 2140 MHz band).

The second transmit signal is input to the second transmit filter 136, for which the acoustic wave device 1 is used, and the first transmit signal is also simultaneously input as an interference wave to the second transmit filter 136. Then, intermodulation distortion (IMD) having a frequency equal to the difference (about 2140 MHz) between the frequencies of the second harmonic (about 3900 MHz) of the second transmit signal and the fundamental wave (about 1760 MHz) of the first transmit signal is generated.

The frequency difference overlaps the frequency band of the second receive signal, and thus, there is a possibility that a harmonic having the frequency equal or substantially equal to the above frequency difference leaks into the receive side.

However, since the acoustic wave device 1 is used for the second transmit filter 136 and the second receive filter 144, the higher-order mode is able to be reduced or prevented, and the intermodulation distortion is also able to be reduced or prevented.

As described above, in the acoustic wave device 1 according to the first preferred embodiment, the surface region 52 is disposed between the low-acoustic-velocity film 4 and the base region 51 on the high-acoustic-velocity support substrate 5. The crystal quality of the high-acoustic-velocity support substrate 5 is better than the crystal quality of the surface region 52, and the crystal quality of the second layer 54 is better than the crystal quality of the first layer 53. Consequently, a higher-order mode generated at a higher frequency than the main-mode frequency is able to be reduced.

The crystal quality of the surface region 52 gradually changes in the thickness direction (first direction D1) in the acoustic wave device 1 according to the first preferred embodiment. Consequently, the higher-order mode is able to be further reduced compared with the case in which the crystal quality of the surface region 52 changes in a stepwise manner in the thickness direction.

The surface region 52 is preferably, for example, greater than 0 and equal to or less than about $0.15\lambda$ in thickness in the acoustic wave device 1 according to the first preferred embodiment. Consequently, the higher-order mode is able to be further reduced.

The material of the low-acoustic-velocity film 4 is silicon oxide in the acoustic wave device 1 according to the first preferred embodiment. Consequently, the temperature characteristics of the acoustic wave device 1 can be improved.

Second Preferred Embodiment

Figure 8:
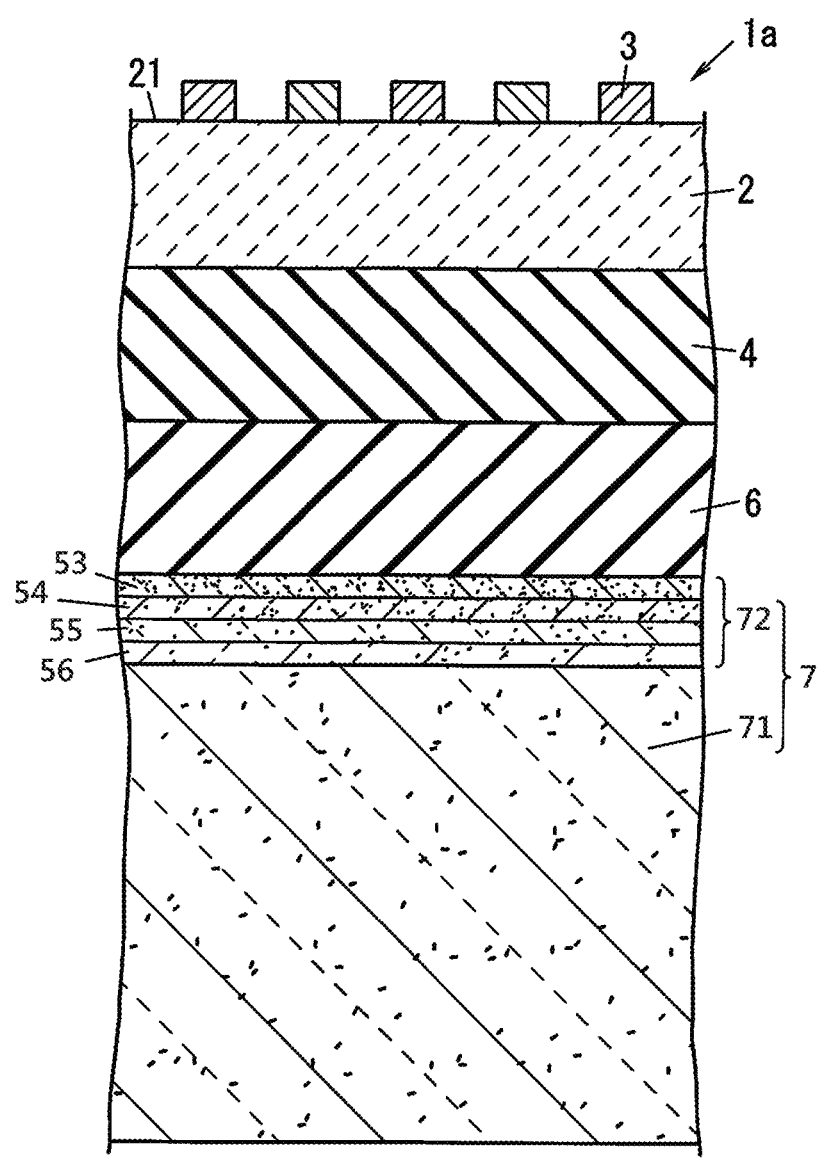
FIG. 8 is a cross sectional view of an acoustic wave device according to a second preferred embodiment of the present invention.

An acoustic wave device 1a according to a second preferred embodiment of the present invention is different from the acoustic wave device 1 according to the first preferred embodiment (refer to FIG. 1) in that the acoustic wave device 1a includes a high-acoustic-velocity film 6 and a support substrate 7, instead of the high-acoustic-velocity support substrate 7, as depicted in FIG. 8. Concerning the acoustic wave device 1a according to the second preferred embodiment, elements that are the same as or similar to those of the acoustic wave device 1 according to the first preferred embodiment are denoted by the same numerals or symbols and will not be described.

As depicted in FIG. 8, the acoustic wave device 1a according to the second preferred embodiment includes a piezoelectric layer 2, an IDT electrode 3, and a low-acoustic-velocity film 4, a high-acoustic-velocity film 6, and a support substrate 7.

The support substrate 7 includes a base region 71 and a surface region 72, which is the same or substantially the same as the high-acoustic-velocity support substrate 5 of the first preferred embodiment. The surface region 72 includes a first layer 73, a second layer 74, a third layer 75, and a fourth layer 76, which are also the same or substantially the same as the surface region 52 in the high-acoustic-velocity support substrate 5 of the first preferred embodiment. In the support substrate 7, the crystal quality of the base region 71 is better than the crystal quality of the surface region 72. The crystal quality of the second layer 74 is better than the crystal quality of the first layer 73.

The high-acoustic-velocity film 6 is directly or indirectly disposed on the support substrate 7. The high-acoustic-velocity film 6 reduces or prevents the leakage of energy of the main-mode acoustic wave into a structure under the high-acoustic-velocity film 6.

If the high-acoustic-velocity film 6 is sufficiently thick, the energy of the main mode acoustic wave is distributed in the entirety or substantially the entirety of the piezoelectric layer 2 and the low-acoustic-velocity film 4 and further in a portion of the high-acoustic-velocity film 6 on the low-acoustic-velocity film 4 side, but is not distributed in the support substrate 7. A mechanism to confine an acoustic wave using the high-acoustic-velocity film 6 is the same as or similar to the mechanism that operates for a surface wave of the Love wave type, which is a non-leaky SH wave. This mechanism is described, for example, in pp. 26-28 of a book entitled "Introduction to simulation technologies for surface acoustic wave devices" by Ken-ya Hashimoto and published by REALIZE Science & Engineering.

The material of the high-acoustic-velocity film 6 is preferably, for example, at least one material selected from the group consisting of diamond-like carbon, aluminum nitride, aluminum oxide, silicon carbide, silicon nitride, silicon, sapphire, lithium tantalate, lithium niobate, quartz, alumina, zirconia, cordierite, mullite, steatite, forsterite, magnesia, and diamond.

The material of the support substrate 7 is preferably, for example, silicon, and the thickness of the support substrate 7 is preferably, for example, 125 μm. The material of the support substrate 7 is not limited to silicon and may be a piezoelectric material, a dielectric material, a semiconductor material, a resin substrate, or other suitable material. Piezoelectric materials such as sapphire, lithium tantalate, lithium niobate, and quartz may be used. Dielectric materials, such as various ceramics and glass may be used, and the various ceramics include alumina, magnesia, silicon nitride, aluminum nitride, silicon carbide, zirconia, cordierite, mullite, steatite, and forsterite. A semiconductor material, such as gallium nitride, may be used.

As described above, in the acoustic wave device 1a according to the second preferred embodiment, the high-acoustic-velocity film 6 is disposed between the low-acoustic-velocity film 4 and the support substrate 7. Consequently, the leakage of the acoustic wave into the support substrate 7 is able to be reduced or prevented.

The preferred embodiments described above only represent some of the various preferred embodiments and modifications of the present invention. Further, various changes may be made to the preferred embodiments in accordance with design or the like as long as the advantageous effects of the present invention are achieved.

The following aspects are disclosed in accordance with the preferred embodiments and the modifications described above.

An acoustic wave device (1) according to a preferred embodiment of the present invention includes a piezoelectric layer (2), an IDT electrode (3), a high-acoustic-velocity support substrate (5), and a low-acoustic-velocity film (4). The IDT electrode (3) is directly or indirectly disposed on the piezoelectric layer (2). The high-acoustic-velocity support substrate (5) is located on an opposite side of the piezoelectric layer (2) from the IDT electrode (3) in the thickness direction of the piezoelectric layer (2). The high-acoustic-velocity support substrate (5) is a substrate in which a bulk wave propagates at a higher acoustic velocity than the acoustic velocity of a bulk wave that propagates in the piezoelectric layer (2). The low-acoustic-velocity film (4) is disposed between the high-acoustic-velocity support substrate (5) and the piezoelectric layer (2) in the thickness direction. The low-acoustic-velocity film (4) is a film in which a bulk wave propagates at a lower acoustic velocity than the acoustic velocity of a bulk wave that propagates in the piezoelectric layer (2). The high-acoustic-velocity support substrate (5) includes a base region (51) and a surface region (52). The surface region (52) is disposed on the low-acoustic-velocity film (4) side of the base region (51) in the thickness direction. The surface region (52) includes a first layer (53) and a second layer (54). The second layer (54) is disposed on the base region (51) side of the first layer (53) in the thickness direction. In the high-acoustic-velocity support substrate (5), the crystal quality of the base region (51) is better than the crystal quality of the surface region (52). The crystal quality of the second layer (54) is better than the crystal quality of the first layer (53).

An acoustic wave device (1) according to a preferred embodiment of the present invention is able to reduce a higher-order mode generated at a higher frequency than the main-mode frequency.

An acoustic wave device (1a) according to a preferred embodiment of the present invention includes a piezoelectric layer (2), an IDT electrode (3), a support substrate (7), a low-acoustic-velocity film (4), and a high-acoustic-velocity film (6). The IDT electrode (3) is directly or indirectly disposed on the piezoelectric layer (2). The support substrate (7) is located on an opposite side of the piezoelectric layer (2) from the IDT electrode (3) in the thickness direction (first direction D1) of the piezoelectric layer (2). The low-acoustic-velocity film (4) is disposed between the support substrate (7) and the piezoelectric layer (2) in the thickness direction. The low-acoustic-velocity film (4) is a film in which a bulk wave propagates at a lower acoustic velocity than the acoustic velocity of a bulk wave that propagates in the piezoelectric layer (2). The high-acoustic-velocity film (6) is disposed between the low-acoustic-velocity film (4) and the support substrate (7). The high-acoustic-velocity film (6) is a film in which a bulk wave propagates at a higher acoustic velocity than the acoustic velocity of a bulk wave that propagates in the piezoelectric layer (2). The support substrate (7) includes a base region (71) and a surface region (72). The surface region (72) is disposed on the low-acoustic-velocity film (4) side of the base region (71) in the thickness direction. The surface region (72) includes a first layer (73) and a second layer (74). The second layer (74) is disposed on the base region (71) side of the first layer (73) in the thickness direction. In the support substrate (7), the crystal quality of the base region (71) is better than the crystal quality of the surface region (72). The crystal quality of the second layer (74) is better than the crystal quality of the first layer (73).

An acoustic wave device (1a) according to a preferred embodiment of the present invention is able to reduce a higher-order mode generated at a higher frequency than the main-mode frequency.

In an acoustic wave device (1, 1a) according to a preferred embodiment of the present invention, the crystal quality of the surface region (52, 72) gradually changes in the thickness direction (first direction D1).

An acoustic wave device (1, 1*a*) according to a preferred embodiment of the present invention is able to further reduce the higher-order mode compared with the case in which the crystal quality of the surface region (52, 72) changes in a stepwise manner in the thickness direction (first direction D1).

In an acoustic wave device (1, 1*a*) according to a preferred embodiment of the present invention, the IDT electrode (3) includes a plurality of electrode fingers (a plurality of first electrode fingers (33) and a plurality of second electrode fingers (34)). The surface region (52, 72) is greater than 0 and equal to or less than about 0.15, in thickness, where X denotes the acoustic-wave wavelength. The acoustic-wave wavelength is determined by the period of electrode fingers, which is equal or substantially equal to the period of the plurality of electrode fingers of the IDT electrode (3).

In an acoustic wave device (1, 1*a*) according to a preferred embodiment of the present invention, the surface region (52, 72) is greater than 0 and equal to or less than about 0.15λ in thickness. Consequently, the higher-order mode is able to be further reduced.

In an acoustic wave device (1, 1*a*) according to a preferred embodiment of the present invention, the surface region (52, 72) is equal to or less than about 0.145λ in thickness.

An acoustic wave device (1, 1*a*) according to a preferred embodiment of the present invention is able to further reduce the higher-order mode.

In an acoustic wave device (1, 1*a*) according to a preferred embodiment of the present invention, the surface region (52, 72) is equal to or greater than about 0.02λ and equal to or less than about 0.11λ in thickness.

An acoustic wave device (1, 1*a*) according to a preferred embodiment of the present invention is able to further reduce the higher-order mode.

In an acoustic wave device (1, 1*a*) according to a preferred embodiment of the present invention, the material of the low-acoustic-velocity film (4) is silicon oxide.

An acoustic wave device (1, 1*a*) according to a preferred embodiment of the present invention is able to improve temperature characteristics of the acoustic wave device (1, 1*a*).

An acoustic wave device (1) according to a preferred embodiment of the present invention includes first filters (a first transmit filter (131) and a first receive filter (141)) and second filters (a second transmit filter (132) and a second receive filter (142)). The first filters are electrically connected to an antenna (a first antenna (201)) and have first pass bands. The second filters are electrically connected to an antenna and have second pass bands, which are located at lower frequencies than the frequencies of the first pass bands. Each of the second filters includes the piezoelectric layer (2), the IDT electrode (3), the high-acoustic-velocity support substrate (5), and the low-acoustic-velocity film (4).

An acoustic wave device (1*a*) according to a preferred embodiment of the present invention includes first filters (a first transmit filter (135) and a first receive filter (145)) and second filters (a second transmit filter (136) and a second receive filter (146)). The first filters are electrically connected to an antenna (a second antenna (204)) and have first pass bands. The second filters are electrically connected to an antenna and have second pass bands, which are located at lower frequencies than the frequencies of the first pass bands. Each of the second filters includes the piezoelectric layer (2), the IDT electrode (3), the support substrate (7), the low-acoustic-velocity film (4), and the high-acoustic-velocity film (6).

A radio-frequency front-end circuit (101, 102) according to a preferred embodiment of the present invention includes a first amplifier circuit (121), a second amplifier circuit (122), a transmit filter, and a receive filter. The first amplifier circuit (121) amplifies a first transmit signal having a first frequency. The second amplifier circuit (122) amplifies a second transmit signal having a second frequency, which is different from the first frequency. The transmit filter has a first pass band including the first frequency, is disposed between the first amplifier circuit (121) and an antenna, and passes the first transmit signal. The receive filter has a second pass band and passes the receive signal received from the antenna. The second pass band includes at least one of a plurality of frequencies that satisfy $n \times Tx1 \pm m \times Tx2$. Here, Tx1 is the first frequency, Tx2 is the second frequency, and n and m are both a natural number. The transmit filter includes any one of the acoustic wave devices (1, 1*a*) according to the first to seventh aspects.

In a radio-frequency front-end circuit (101, 102) according to a preferred embodiment of the present invention, the surface region (52, 72) is disposed between the low-acoustic-velocity film (4) and the base region (51, 71) in the acoustic wave device (1, 1*a*). The crystal quality of the base region (51, 71) is better than the crystal quality of the surface region (52, 72), and the crystal quality of the second layer (54, 74) is better than the crystal quality of the first layer (53, 73). Consequently, a higher-order mode can be reduced.

In addition, a radio-frequency front-end circuit (101, 102) according to a preferred embodiment of the present invention is able to reduce intermodulation distortion.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An acoustic wave device comprising:
   a piezoelectric layer;
   an interdigital transducer (IDT) electrode directly or indirectly disposed on the piezoelectric layer;
   a high-acoustic-velocity support substrate located on an opposite side of the piezoelectric layer from the IDT electrode in a thickness direction of the piezoelectric layer and in which a bulk wave propagates at a higher acoustic velocity than an acoustic velocity of a bulk wave that propagates in the piezoelectric layer; and
   a low-acoustic-velocity film disposed between the high-acoustic-velocity support substrate and the piezoelectric layer in the thickness direction and in which a bulk wave propagates at a lower acoustic velocity than the acoustic velocity of the bulk wave that propagates in the piezoelectric layer; wherein
   the high-acoustic-velocity support substrate includes:
      a base region; and
      a surface region disposed nearer to the low-acoustic-velocity film than the base region in the thickness direction; and
   the surface region includes:
      a first layer; and
      a second layer disposed nearer to the base region than the first layer in the thickness direction;

in the high-acoustic-velocity support substrate, crystal quality of the base region is better than crystal quality of the surface region; and
crystal quality of the second layer is better than crystal quality of the first layer.

2. The acoustic wave device according to claim 1, wherein the crystal quality of the surface region changes in the thickness direction.

3. The acoustic wave device according to claim 1, wherein the IDT electrode includes a plurality of electrode fingers; and
the surface region is greater than 0 and equal to or less than about 0.15λ in thickness, where λ denotes an acoustic-wave wavelength, the acoustic-wave wavelength being determined by a period of electrode fingers, which is equal or substantially equal to a period of the plurality of electrode fingers of the IDT electrode.

4. The acoustic wave device of claim 3, wherein the surface region is equal to or less than about 0.145λ in thickness.

5. The acoustic wave device of claim 4, wherein the surface region is equal to or greater than about 0.02λ and equal to or less than about 0.11λ in thickness.

6. The acoustic wave device according to claim 1, wherein a material of the low-acoustic-velocity film is silicon oxide.

7. The acoustic wave device according to claim 1, further comprising:
a first filter electrically connected to an antenna and having a first pass band; and
a second filter electrically connected to the antenna and having a second pass band, which is located at lower frequencies than frequencies of the first pass band; wherein
the second filter includes:
the piezoelectric layer;
the IDT electrode;
the high-acoustic-velocity support substrate; and
the low-acoustic-velocity film.

8. A radio-frequency front-end circuit comprising:
a first amplifier circuit that amplifies a first transmit signal having a first frequency;
a second amplifier circuit that amplifies a second transmit signal having a second frequency, which is different from the first frequency;
a transmit filter that has a first pass band including the first frequency and that is disposed between the first amplifier circuit and an antenna and passes the first transmit signal; and
a receive filter that has a second pass band and passes a receive signal received from the antenna; wherein
the second pass band includes at least one of a plurality of frequencies that satisfy n×Tx1±m×Tx2, where Tx1 is the first frequency, Tx2 is the second frequency, and n and m are both natural numbers; and
the transmit filter includes the acoustic wave device according to claim 1.

9. The radio-frequency front-end circuit according to claim 8, wherein the crystal quality of the surface region gradually changes in the thickness direction.

10. The radio-frequency front-end circuit according to claim 8, wherein
the IDT electrode includes a plurality of electrode fingers; and
the surface region is greater than 0 and equal to or less than about 0.15λ in thickness, where λ denotes an acoustic-wave wavelength, the acoustic-wave wavelength being determined by a period of electrode fingers, which is equal or substantially equal to a period of the plurality of electrode fingers of the IDT electrode.

11. An acoustic wave device comprising:
a piezoelectric layer;
an IDT electrode directly or indirectly disposed on the piezoelectric layer;
a support substrate located on an opposite side of the piezoelectric layer from the IDT electrode in a thickness direction of the piezoelectric layer;
a low-acoustic-velocity film disposed between the support substrate and the piezoelectric layer in the thickness direction and in which a bulk wave propagates at a lower acoustic velocity than an acoustic velocity of a bulk wave that propagates in the piezoelectric layer; and
a high-acoustic-velocity film disposed between the low-acoustic-velocity film and the support substrate and in which a bulk wave propagates at a higher acoustic velocity than the acoustic velocity of the bulk wave that propagates in the piezoelectric layer; wherein
the support substrate includes:
a base region; and
a surface region disposed nearer to the low-acoustic-velocity film than the base region in the thickness direction; and
the surface region includes:
a first layer; and
a second layer disposed nearer to the base region than the first layer in the thickness direction;
in the support substrate, crystal quality of the base region is better than crystal quality of the surface region; and
crystal quality of the second layer is better than crystal quality of the first layer.

12. The acoustic wave device according to claim 11, wherein the crystal quality of the surface region gradually changes in the thickness direction.

13. The acoustic wave device according to claim 11, wherein
the IDT electrode includes a plurality of electrode fingers; and
the surface region is greater than 0 and equal to or less than about 0.15λ in thickness, where λ denotes an acoustic-wave wavelength, the acoustic-wave wavelength being determined by a period of electrode fingers, which is equal or substantially equal to a period of the plurality of electrode fingers of the IDT electrode.

14. The acoustic wave device according to claim 13, wherein the surface region is equal to or less than about 0.145λ in thickness.

15. The acoustic wave device according to claim 14, wherein the surface region is equal to or greater than about 0.02λ and equal to or less than about 0.11λ in thickness.

16. The acoustic wave device according to claim 7, wherein a material of the low-acoustic-velocity film is silicon oxide.

17. The acoustic wave device according to claim 11 further comprising:
a first filter electrically connected to an antenna and having a first pass band; and
a second filter electrically connected to the antenna and having a second pass band, which is located at lower frequencies than frequencies of the first pass band; wherein
the second filter includes:

the piezoelectric layer;
the IDT electrode;
the support substrate;
the low-acoustic-velocity film; and
the high-acoustic-velocity film.

18. A radio-frequency front-end circuit comprising:
a first amplifier circuit that amplifies a first transmit signal having a first frequency;
a second amplifier circuit that amplifies a second transmit signal having a second frequency, which is different from the first frequency;
a transmit filter that has a first pass band including the first frequency and that is disposed between the first amplifier circuit and an antenna and passes the first transmit signal; and
a receive filter that has a second pass band and passes a receive signal received from the antenna; wherein
the second pass band includes at least one of a plurality of frequencies that satisfy n×Tx1±m×Tx2, where Tx1 is the first frequency, Tx2 is the second frequency, and n and m are both natural numbers; and
the transmit filter includes the acoustic wave device according to claim 11.

19. The radio-frequency front-end circuit according to claim 18, wherein the crystal quality of the surface region changes in the thickness direction.

20. The radio-frequency front-end circuit according to claim 18, wherein
the IDT electrode includes a plurality of electrode fingers; and
the surface region is greater than 0 and equal to or less than about $0.15\lambda$ in thickness, where $\lambda$ denotes an acoustic-wave wavelength, the acoustic-wave wavelength being determined by a period of electrode fingers, which is equal or substantially equal to a period of the plurality of electrode fingers of the IDT electrode.

* * * * *